United States Patent [19]
Wang

[11] Patent Number: 5,767,726
[45] Date of Patent: Jun. 16, 1998

[54] FOUR TERMINAL RF MIXER DEVICE

[75] Inventor: Hongmo Wang, Watchung, N.J.

[73] Assignee: Lucent Technologies Inc., Murray Hill, N.J.

[21] Appl. No.: 734,658

[22] Filed: Oct. 21, 1996

[51] Int. Cl.⁶ ........................................... G06F 7/44
[52] U.S. Cl. .................. 327/356; 327/116; 327/119; 455/319; 455/333; 331/42; 333/218
[58] Field of Search .......................... 327/113–122, 355, 327/356; 331/42, 333; 333/25, 218; 455/318, 319, 326, 330, 333

[56] References Cited

U.S. PATENT DOCUMENTS

| | | | |
|---|---|---|---|
| 4,541,122 | 9/1985 | Kimura | 455/333 |
| 4,581,768 | 4/1986 | Aoki et al. | 455/333 |
| 4,814,649 | 3/1989 | Young | 327/113 |
| 4,841,169 | 6/1989 | Tsironis | 327/113 |
| 4,845,389 | 7/1989 | Pyndiah et al. | 327/355 |

Primary Examiner—Timothy P. Callahan
Assistant Examiner—Kenneth B. Wells

[57] ABSTRACT

A four terminal multiplication circuit capable of mixing up to three input signals. The circuit includes a MOS transistor having gate, source, drain and back-gate terminals. When the circuit is used as an RF mixer or downconverter, an RF signal is provided to the gate terminal and a local oscillator signal is provided to the back-gate terminal. A DC voltage is applied to the source terminal for biasing the transistor and the mixed/downconverted output (IF) signal is obtained from the drain terminal. A single balanced and a double balanced mixer circuit are also disclosed. In the single balanced circuit, two MOS transistors are used; the RF signal is applied to the gate terminals with the positive phase LO component applied to one back-gate terminal and the negative phase local oscillator (LO) component applied to the other back-gate terminal for producing a positive phase and a negative phase IF signal. In the double balanced circuit, four MOS transistors are used; the positive phase RF signal is applied to the gate terminals of two of the transistors and the negative phase RF signal is applied to the gate terminals of the other two transistors. Likewise, the positive phase LO signal is applied to two of the transistors and the negative phase LO signal is applied to the other two transistors.

10 Claims, 5 Drawing Sheets

5,767,726

FOUR TERMINAL RF MIXER DEVICE

BACKGROUND OF THE INVENTION

I. Field of the Invention

The present invention relates to a circuit element having multiple terminals for multiplying multiple input signals to produce an output signal. More particularly, the present invention pertains to a multiple terminal circuit for use as an RF mixer for shifting the center frequencies of input signals.

II. Description of Related Art

Mixer circuits for downconverting received RF signals to a lower center frequency or intermediate frequency (IF) are well known. Such circuits multiply or mix a received RF signal (provided to the mixer circuit by an antenna, for example) with a local oscillator (LO) signal. The resulting output signal or IF signal is frequency shifted or heterodyned by the frequency of the LO signal.

Heretofore known downconverters or mixer circuits employ Metal Oxide Semiconductor (MOS) Field Effect transistors which are operated as three-terminal devices. Such a device is depicted in cross-section in FIG. 1A and schematically in FIG. 1B. The depicted MOS transistor 10 (designated as M) is a P channel device that is formed on a P-doped semiconductor substrate 12 having an upper major surface 13. Transistor M includes an N-well region 14 in which p+ doped source and drain regions 16, 18 are formed. The source and drain regions are spaced apart and a channel region 20 is induced therebetween when the transistor M is appropriately biased in a manner well-known to those having ordinary skill in the art. An oxide layer 22 is formed over the channel region, upon which a gate terminal 26 is created for controlling the flow of carriers (in this case p-type carriers) in the channel 20. The transistor M is used by applying appropriate voltages to its terminals, including a source terminal (S) 24 that accesses the source region 16, a drain terminal (D) 28 for accessing the drain region 18, and the gate terminal (G) 26 for controlling the flow of carriers through the channel region 20.

Transistor M also includes a back-gate terminal (B) 30 which accesses the well region 14 through the major surface 13. In prior art mixers, the back-gate terminal B is connected to a fixed voltage source such as a power supply or connected to the source terminal S. Thus, the output current of the transistor M is controlled by the voltage applied to the gate terminal G, e.g. the voltage difference between the gate terminal and the source terminal ($V_{GS}$). This configuration (i.e. with the back-gate terminal tied or connected to the source terminal S) is depicted in prior art FIGS. 1A and 1B.

With reference now to FIG. 2, a prior art mixer circuit 32 incorporating the MOS device of FIG. 1B is there shown. The mixing circuit is also depicted in block form in FIG. 3 and, as explained above, in operation mixes or shifts an incoming RF signal by an LO signal, resulting in an IF signal output therefrom. As shown in FIG. 2, the MOS device M has its back-gate terminal B conventionally tied to its source terminal S. A received RF signal is applied to a first input terminal or gate terminal G and an LO signal is applied to a second input terminal 38, connected to the source terminal S via a capacitor 39. As the LO input is a signal, the source terminal cannot connect to a constant voltage source (which inherently has a zero impedance value) because such a configuration will prevent the introduction of the LO signal to the source terminal. To alleviate this problem, mixer circuit 32 includes a load 34, such as a resistor or a tank circuit, disposed between the source terminal S and a fixed voltage source $V_{DD}$ which serves to allow proper input of the LO signal to terminal 38 as shown. It should be realized that although the back-gate terminal B is shown in FIG. 2 as tied to the source terminal, it can, likewise, be tied to the $V_{DD}$ source without affecting operation of the prior art mixer circuit 32.

The prior art mixer circuit 32 shown in FIG. 2 has several drawbacks. For example, if load 34 is a resistor, noise is introduced and a higher value for $V_{DD}$ is needed to operate the circuit in order to compensate for the voltage drop that inherently occurs across the resistor. If, however, load 34 is a tank circuit, although no voltage drop will result, thus not warranting a higher value for $V_{DD}$, the inclusion of an inductor (a component of the tank circuit) is technically difficult and costly. These are unwanted results because it is desirable that such RF mixer circuits remain low in cost and operate on as low a voltage as possible.

SUMMARY OF THE INVENTION

An improvement has been achieved over the prior art by recognizing that a MOS transistor can be operated as a four terminal device, without the need for a load disposed between a fixed voltage supply and a source terminal, to provide a mixer circuit capable of operating at lower voltages with less noise.

The invention thus comprises a method wherein a MOS transistor is used as a multiplying or mixing circuit for mixing a plurality of input signals to form an output signal. A first input signal (e.g. an RF signal) is provided to a gate terminal of the MOS transistor. A second input signal (e.g. an LO signal) is provided to a back-gate terminal of the MOS transistor so that a tank circuit or load is not required. The source terminal may be biased with a DC voltage or may receive a third input signal, and an output signal, which is a mix of the input signals, is obtained from a drain terminal.

In other preferred embodiments, a single balanced circuit and a double balanced mixer circuit are provided. In the single balanced mixer circuit, two MOS transistors are used and a single ended RF signal is applied to both gate terminals while opposite phase portions of an LO signal are applied to the back-gate terminals. Separate output signals result, i.e. a positive phase output signal and a negative phase output signal.

In the double balanced circuit, four transistors are used. The positive phase portion of the RF signal is provided to the gate terminals of two of the transistors and the negative phase portion of the RF signal is provided to the gate terminals of the remaining two transistors. Likewise, the positive phase portion of the LO signal is provided to the back-gate terminals of two of the transistors and the negative phase portion of the LO signal is provided to the back-gate terminals of the remaining two transistors. The resulting output signals (two positive phase signals and two negative phase signals) are joined to form a single combined positive phase output signal and a single combined negative phase output signal.

Other objects and features of the present invention win become apparent from the following detailed description considered in conjunction with the accompanying drawings. It is to be understood, however, that the drawings are designed solely for purposes of illustration and not as a definition of the limits of the invention, for which reference should be made to the appended claims.

BRIEF DESCRIPTION OF THE DRAWINGS

In the drawings, wherein like reference numerals correspond to like elements throughout the several views.

DETAILED DESCRIPTION OF THE
PRESENTLY PREFERRED EMBODIMENTS

Figure 4:
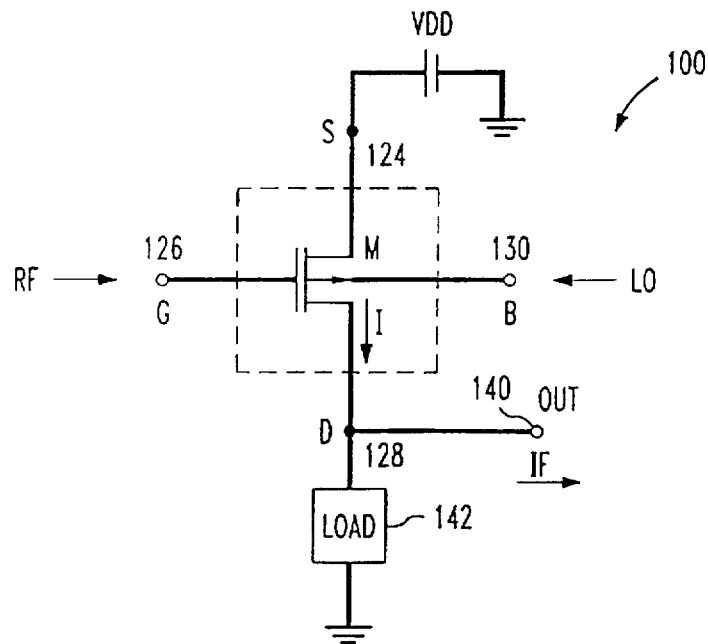
FIG. 4 is a schematic representation of a mixer circuit constructed in accordance with one embodiment of the present invention.

Turning now to the figures and initially to FIG. 4 thereof, a detailed description of the inventive device and circuit arrangement will now be provided. For simplicity and convenience, the description herein is set forth in the context of a mixer or down converter application for use in the field of communication devices such as receiver circuits. However, the invention is in no way limited to such specific applications and may be applied for multiplying any frequency component signals for use in a variety of applications.

With reference to FIG. 4, a schematic representation of a multiplication circuit 100 for use, for example, in mixing or downconverting a received RF signal is illustrated. The circuit 100 includes a P-channel MOS transistor M having first, second and third input terminals corresponding to a source (S), gate (G) and back-gate (B) 124, 126 and 130, respectively. As shown, and in accordance with the invention, back-gate terminal 130 is not tied to the source terminal 124—as is the case in the prior art circuit 32 in FIG. 2. A fourth terminal which serves as an output terminal, corresponding to a drain (D) 128, is also provided from which an output signal is obtained. A load 142 is shown connected between the drain terminal 128 and ground, and the source terminal is maintained at a high DC potential, shown as $V_{DD}$.

Figure 1A:
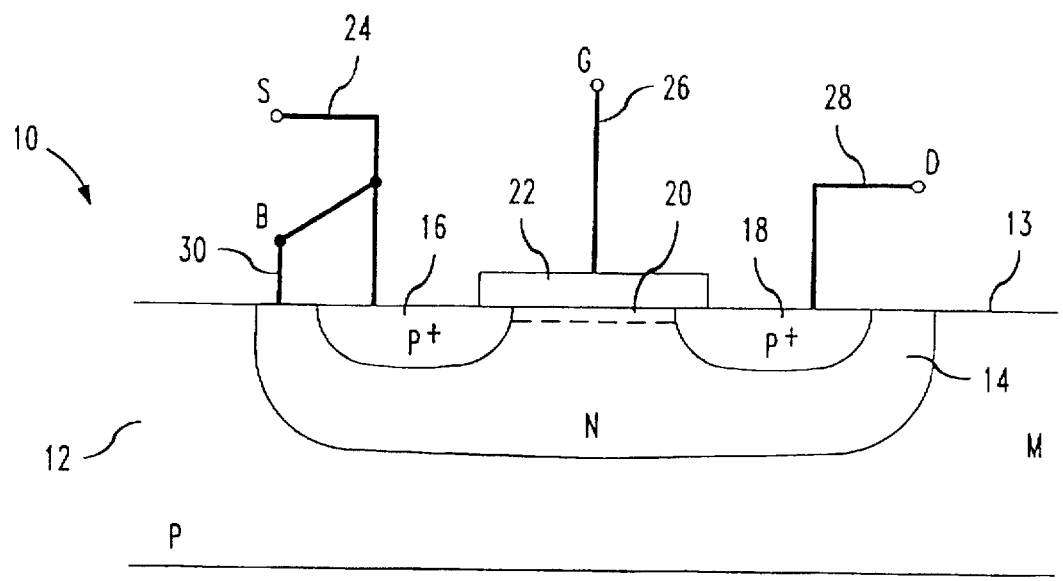
FIG. 1A is a cross-sectional view of the construction of a conventional MOS transistor.
Figure 1B:
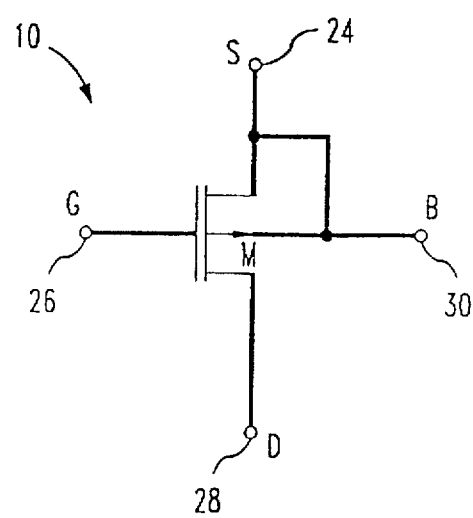
FIG. 1B is a schematic representation of the conventional MOS transistor of FIG. 1A.
Figure 2:
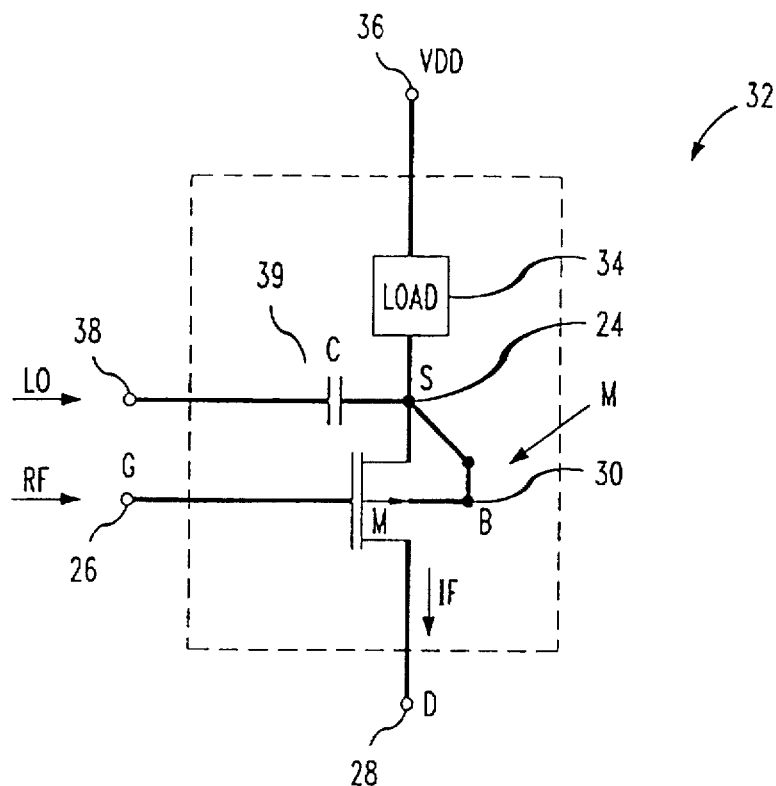
FIG. 2 is a schematic representation of a prior art mixer circuit.
Figure 3:
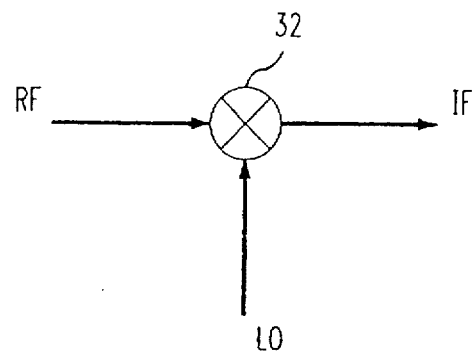
FIG. 3 is a schematic representation of an RF mixer.

As described above, it is known that by fixing the back-gate terminal 130 at a high potential—such as by tying it to the source terminal 124 as in the prior art circuit of FIG. 2—the transistor M operates in a conventional manner, that is, the output or drain current is controlled by the voltage applied to the gate terminal. Conversely, if the gate terminal is fixed at a high voltage (e.g. tied to the source terminal), then the output current of the transistor M is controlled by the back-gate (B) terminal and the transistor M exhibits bipolar junction transistor (BJT) properties wherein the back-gate terminal functions as a base terminal, the source terminal functions as an emitter terminal and the drain terminal functions as a collector terminal. In addition, it is also widely recognized that the threshold voltage of a MOS transistor is a fixed value when the back-gate terminal is tied to a fixed voltage. However, when the back-gate terminal is not fixed, i.e. when a signal is applied thereto, the threshold voltage is no longer fixed and will vary depending on the back-gate voltage.

Recognizing these properties of a MOS transistor, applicant has discovered that by applying signals simultaneously to both the gate and back-gate terminals, the MOS transistor exhibits both MOS and BJT properties, making such a configuration particularly well-suited for mixing or multiplying input signals to generate an output signal. For example, a received RF signal (which can be provided from any known source, such as an antenna) is provided to the first terminal or gate (G) and a local oscillator (LO) signal is provided to the back-gate (B). A resulting output current or drain current I is generated at drain terminal 128. If a voltage output is desired, load 142 is included to generate a voltage drop at an output terminal 140. However, if an output current is desired, load 142 is not needed and the drain current I serves as the output signal.

When the circuit 100 is used as a mixer or downconverter, the center frequency of the incoming RF signal is shifted downward by the LO frequency, resulting in an output signal at an intermediate frequency (IF) seen at output terminal 140. It should be noted that although the operation of circuit 100 has been described with the RF signal applied to the gate terminal and the LO signal applied to the back-gate terminal, the circuit 100 will also operate with the RF signal applied to the back-gate terminal and the LO applied to the gate terminal.

Figure 7:
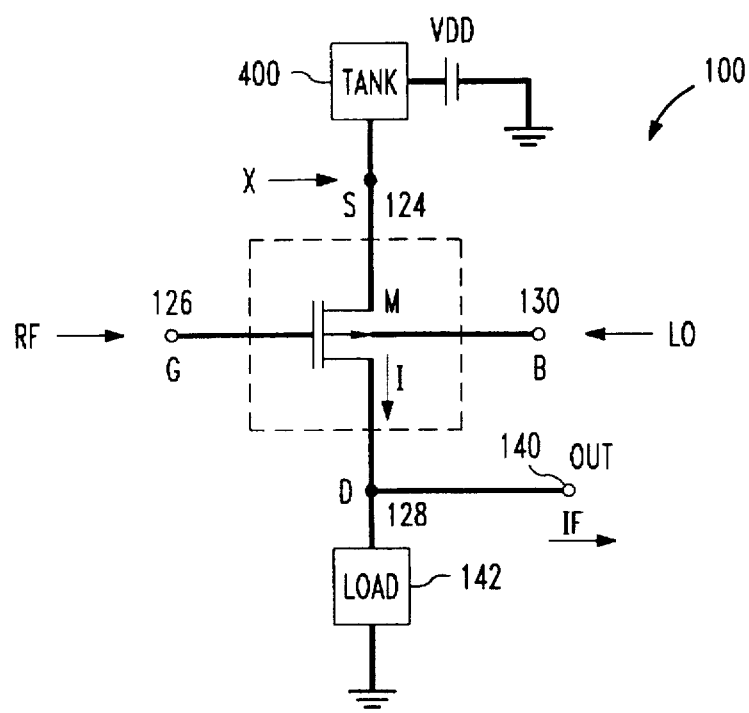
FIG. 7 is a schematic representation of a alternative embodiment of the mixer circuit of FIG. 4.

The circuit 100 may also be used to mix the received RF signal with a second signal (i.e. a signal in addition to the LO signal) which can be applied to the source terminal, as shown in FIG. 7. In other words, a tank circuit 400 may be disposed between $V_{DD}$ and the source terminal to provide for adequate biasing of the transistor M and a second signal (x) can then be applied to the source terminal so that the incoming RF signal is mixed or downconverted by both an LO signal applied to the back-gate (B) and a second signal (x) applied to the source terminal.

When the RF signal is mixed with a LO signal applied to the back-gate, the circuit 100 of FIG. 4 can be operated at a lower voltage and be less costly than the prior art circuit 32 of FIG. 2 because there is no need for a load connected between the source terminal and $V_{DD}$ to accommodate input of the LO signal to the source terminal. In other words, and as stated above, there will be no introduced noise and voltage drop (resulting from a resistor load) and there will be no added cost (resulting from inclusion of an IC inductor in a tank circuit load). In addition, circuit 100 can employ long or short channel transistors.

Figure 5:
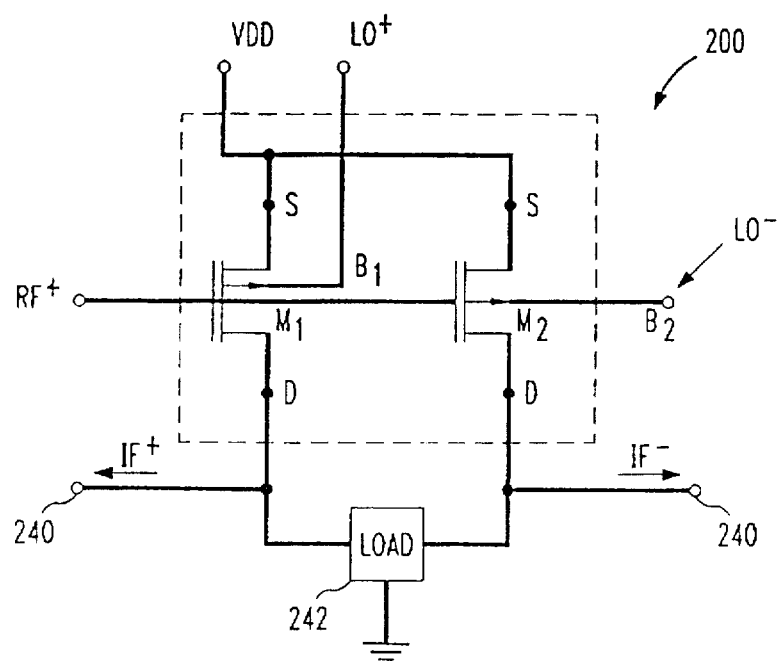
FIG. 5 is a schematic representation of a partially balanced mixer circuit in accordance with another embodiment of the invention.

Referring now to FIG. 5, a single balanced mixer circuit 200 is there depicted. Unlike the mixer circuit 100 of FIG. 4, the illustrated circuit 200 includes two MOS transistors $M_1$ and $M_2$. Such a circuit is particularly useful when the received RF signal is single ended, as opposed to a balanced signal. In FIG. 5, a single ended RF signal (shown as RF+) is indicated as being input to the gate terminals of both $M_1$ and $M_2$. The source terminals of both transistors are connected to a high voltage source ($V_{DD}$) and the positive and negative phase portions of a local oscillator signal (shown as LO+ and LO−) are input to the respective back-gate terminals $G_1'$ and $G_2'$ of transistors $M_1$ and $M_2$. The output signal or drain current of transistor $M_1$ is a positive phase signal (labelled IF+) and the output signal or drain current of transistor $M_2$ is a negative phase signal (labelled IF−). Both intermediate frequency signals (IF+ and IF−) can be obtained from the output terminals 240 as shown.

As explained above with respect to FIG. 4, if an output signal in the form of a voltage is desired, a load 242 may be included for creating a voltage drop using the drain currents of transistors $M_1$ and $M_2$. If a current output is desired, on the other hand, load 242 is not needed. Also, and as is well-known in the art, if the generated IF signals are kept on-chip, i.e. used for other microchip applications and calculations, the balanced separate outputs (IF+ and IF−) are preferred. However, if the output signals are taken off-chip, then the balanced signals would generally be combined, in a known manner, to avoid signal loss for use in other applications.

Figure 6:
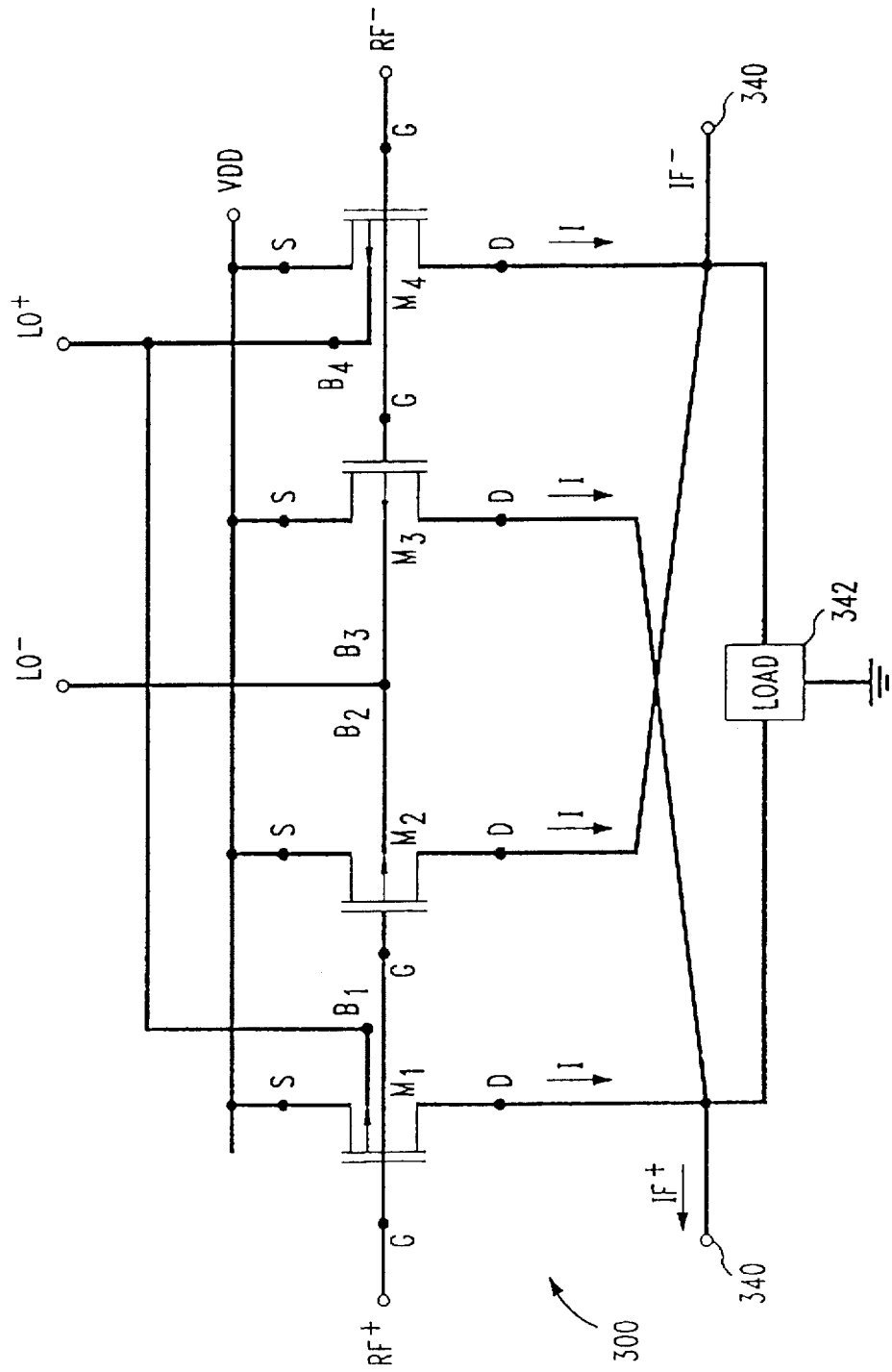
FIG. 6 is a schematic representation of a double balanced mixer circuit in accordance with yet another embodiment of the present invention.

With reference now to FIG. 6, a double balanced mixer circuit 300 constructed in accordance with the invention, is there depicted. As shown, circuit 300 includes four MOS transistors ($M_1$, $M_2$, $M_3$ and $M_4$), the source terminal of each of which is at a high voltage indicated as $V_{DD}$. The circuit accommodates four inputs, namely the positive and negative phase portions of an incoming RF signal, and the positive and negative phase portions of a generated local oscillator (LO) signal. In the configuration of FIG. 6, the positive phase portion of the RF signal (RF+) is applied to the gate terminals of transistors $M_1$ and $M_2$, whereas the negative phase portion of the RF signal (RF−) is applied to the gate terminals of $M_3$ and $M_4$. In addition, the positive phase portion of the local oscillator signal (Lo+) is applied to the back-gate terminals (B)) of $M_1$ and $M_4$, while the negative phase portion of the local oscillator signal (LO−) is applied to the back-gate terminals of transistors $M_2$ and $M_3$.

The output currents or drain currents from each transistor are combined to form two single-ended output signals IF+ and IF−. Specifically, the drain currents of transistors $M_1$ and $M_3$ combine to form IF+ at one of the output terminals 340, and the drain currents from transistors $M_2$ and $M_4$ combine to form another single ended signal (IF−) at the other output terminal 340. As in the earlier described embodiments, a load 342 is provided if an output voltage signal is desired; if an output current signal is desired, however, then load 342 is not needed.

Thus, while there have shown and described and pointed out fundamental novel features of the invention as applied to preferred embodiments thereof, it will be understood that various omissions and substitutions and changes in the form and details of the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. In addition, although the MOS transistors used in the inventive circuits described herein are disclosed as P-channel devices, N-channel devices may be substituted therefor in a manner well-known to those having ordinary skill in the art. It is the intention, therefore, to be limited only as indicated by the scope of the claims appended hereto.

I claim:

1. A method of mixing a plurality of frequency dependent input signals to form a frequency dependent output signal using a MOS transistor having a gate terminal, a source terminal, a back-gate terminal and a drain terminal, said method comprising the steps of:

providing a first input signal having frequency components to the gate terminal;

providing a second input signal having frequency components to the back-gate terminal;

providing a third input signal to the source terminal; and obtaining from the drain terminal an output signal which is a function of at least the first and second input signals.

2. The method of claim 1, wherein the third input signal comprises a DC voltage.

3. The method of claim 1, wherein the third input signal comprises a frequency dependent signal.

4. The method of claim 1, wherein the first frequency dependent input signal comprises a received RF signal having a predetermined first center frequency and wherein the second frequency dependent signal comprises a local oscillator signal having a predetermined second frequency other than the value of the first predetermined center frequency, so that the resulting output signal has a center frequency substantially equal to the difference of the first and second predetermined center frequencies of the first and second input signals, and substantially equal to the sum of the first and second predetermined center frequencies of the first and second input signals.

5. A single balanced mixer circuit for downconverting a single-ended input RF signal having a predetermined center frequency value to a lower center frequency value by mixing the input RF signal with a balanced local oscillator signal having a positive phase portion and a negative phase portion; said circuit comprising:

a first MOS transistor having a gate terminal, a source terminal, a back-gate terminal and a drain terminal, said first transistor receiving the input RF signal as a first input signal through one of the gate terminal and back-gate terminal, and receiving one of the positive and negative phase portions of the local oscillator signal through the other of the gate terminal and back-gate terminal, for generating a first output signal at the drain terminal;

a second MOS transistor having a gate terminal, a source terminal, a back-gate terminal and a drain terminal, said second transistor receiving the input RF signal as a first input signal through said one of the gate terminal and back gate terminal of said second MOS transistor and receiving the other of the positive and negative phase portions of the local oscillator signal through said other of the gate terminal and the back-gate terminal of said second MOS transistor for generating a second output signal at the drain terminal of said second MOS transistor, said second output signal being opposite in phase to said first output signal; and means connected to and for biasing the source terminals of said first and second MOS transistors.

6. The mixer circuit of claim 5, further comprising a load connected between the drain terminals of the first and second transistors and ground so that the first and second output signals comprise voltage signals.

7. A double balanced mixer circuit for downconverting a balanced input RF signal having a positive phase portion and a negative phase portion and having a predetermined center frequency value, to a lower center frequency value by mixing the RF signal with a balanced local oscillator signal having a positive phase portion and a negative phase portion, said circuit comprising:

a first MOS transistor having a gate terminal, a source terminal, a back-gate terminal and a drain terminal, said first transistor receiving as a first input signal one of the positive and negative phase portions of the input RF signal through the gate terminal, and receiving as a second input signal one of the positive and negative phase portions of the local oscillator signal through the back-gate terminal, for generating a first output signal at the drain terminal;

a second MOS transistor having a gate terminal, a source terminal, a back-gate terminal and a drain terminal, said second transistor receiving as a first input signal said one of the positive and negative phase portions of the input RF signal through said second MOS transistor gate terminal, and receiving as a second input signal the other of the positive and negative phase portions of the local oscillator signal through the back-gate terminal of said second MOS transistor, for generating a second output signal at the drain terminal of said second MOS transistor, said second output signal being opposite in phase to said first output signal;

a third MOS transistor having a gate terminal, a source terminal, a back-gate terminal and a drain terminal, said third transistor receiving as a first input signal the other of the positive and negative phase portions of the input RF signal through said third MOS transistor gate terminal, and receiving as a second input signal said other of the positive and negative phase portions of the local oscillator signal through the back-gate terminal of said third MOS transistor for generating a third output signal at the drain terminal of said third MOS transistor, said third output signal being equal in phase to said first output signal; and a fourth MOS transistor having a gate terminal, a source terminal, a back-gate terminal and a drain terminal, said fourth transistor receiving as a first input signal said other of the positive and negative phase portions of the input RF signal through said fourth MOS transistor gate terminal, and receiving as a second input signal said one of said positive and negative phase portions of the local oscillator signal through the back-gate terminal of said fourth MOS transistor for generating a fourth output signal at the drain terminal of said fourth transistor, said fourth output signal being equal in phase to said second output signal;

the drain terminals of said first and third transistors being connected for forming from said first and third output signals a first combined output signal having a phase, and the drain terminals of said second and fourth transistors being connected for forming from said second and fourth output signals a second combined output signal having a phase opposite the phase of said first combined output signal; and means connected to and for biasing the source terminals of said first, second, third and fourth transistors.

8. The mixer circuit of claim 7, further comprising a load connected between the drain terminals of said first, second, third and fourth transistors and a ground terminal, so that the first and second combined output signals comprise voltage signals.

9. A double balanced mixer circuit for downconverting a balanced input RF signal having a positive phase portion and a negative phase portion and having a predetermined center frequency value, to a lower center frequency value by mixing the RF signal with a balanced local oscillator signal having a positive phase portion and a negative phase portion, said circuit comprising:

a first MOS transistor having a gate terminal, a source terminal, a back-gate terminal and a drain terminal, said first transistor receiving as a first input signal one of the positive and negative phase portions of the local oscillator signal through the gate terminal, and receiving as a second input signal one of the positive and negative phase portions of the RF signal through the back-gate terminal, for generating a first output signal at the drain terminal;

a second MOS transistor having a gate terminal, a source terminal, a back-gate terminal and a drain terminal, said second transistor receiving as a first input signal said one of the positive and negative phase portions of the local oscillator signal through said second MOS transistor gate terminal, and receiving as a second input signal the other of the positive and negative phase portions of the RF signal through the back-gate terminal of said second MOS transistor, for generating a second output signal at the drain terminal of said second MOS transistor, said second output signal being opposite in phase to said first output signal;

a third MOS transistor having a gate terminal, a source terminal, a back-gate terminal and a drain terminal, said third transistor receiving as a first input signal the other of the positive and negative phase portions of the local oscillator signal through said third MOS transistor gate terminal, and receiving as a second input signal said other of the positive and negative phase portions of the RF signal through the back-gate terminal of said third MOS transistor for generating a third output signal at the drain terminal of said third MOS transistor, said third output signal being equal in phase to said first output signal; and a fourth MOS transistor having a gate terminal, a source terminal, a back-gate terminal and a drain terminal, said fourth transistor receiving as a first input signal said other of the positive and negative phase portions of the local oscillator signal through said fourth MOS transistor gate terminal, and receiving as a second input signal said one of said positive and negative phase portions of the RF signal through the back-gate terminal of said fourth MOS transistor for generating a fourth output signal at the drain terminal of said fourth transistor, said fourth output signal being equal in phase to said second output signal;

the drain terminals of said first and third transistors being connected for forming from said first and third output signals a first combined output signal having a phase, and the drain terminals of said second and fourth transistors being connected for forming from said second and fourth output signals a second combined output signal having a phase opposite the phase of said first combined output signal; and means connected to and for biasing the source terminals of said first, second, third and fourth transistors.

10. The mixer circuit of claim 9, further comprising a load connected between the drain terminals of said first, second, third and fourth transistors and a ground terminal, so that the first and second combined output signals comprise voltage signals.

* * * * *